(12) United States Patent
Gammel

(10) Patent No.: US 7,855,669 B2
(45) Date of Patent: Dec. 21, 2010

(54) CIRCUIT DEVICE TO GENERATE A HIGH PRECISION CONTROL SIGNAL

(75) Inventor: John Gammel, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 35 days.

(21) Appl. No.: 12/238,484

(22) Filed: Sep. 26, 2008

(65) Prior Publication Data

US 2010/0080336 A1 Apr. 1, 2010

(51) Int. Cl.
*H03M 1/66* (2006.01)

(52) U.S. Cl. ............... 341/144; 327/172; 327/175; 341/126

(58) Field of Classification Search .............. None
See application file for complete search history.

(56) References Cited

U.S. PATENT DOCUMENTS

| | | | |
|---|---|---|---|
| 3,603,977 A | 9/1971 | Szabo et al. ............... 340/347 |
| 3,646,545 A | 2/1972 | Naydan et al. ............. 340/347 |
| 3,651,317 A | 3/1972 | Falk .......................... 235/197 |
| 3,789,393 A | 1/1974 | Tripp ........................ 340/347 |
| 3,823,396 A | 7/1974 | Lode ......................... 340/347 |
| 3,838,416 A | 9/1974 | Brown ....................... 340/347 |
| 4,064,423 A | 12/1977 | Atkisson, Jr. ............... 364/718 |
| 4,087,813 A | 5/1978 | Minner et al. .............. 340/347 |
| 4,095,218 A | 6/1978 | Crouse ...................... 340/347 |
| 4,096,475 A | 6/1978 | Ong ........................... 340/347 |
| 4,117,476 A | 9/1978 | Koyanagi .................. 340/347 |
| 4,233,591 A | 11/1980 | Murata et al. ............. 340/347 |
| 4,330,751 A * | 5/1982 | Swain ........................ 327/114 |
| 4,573,039 A | 2/1986 | Suzuki et al. .............. 340/347 |
| 4,590,457 A | 5/1986 | Amir ......................... 340/347 |
| 4,742,329 A | 5/1988 | Yamada et al. ............. 340/347 |
| 4,862,170 A | 8/1989 | Hashimoto et al. .......... 341/144 |
| 5,361,029 A * | 11/1994 | Rider et al. ................ 324/326 |
| 5,774,084 A | 6/1998 | Brombaugh et al. ........ 341/152 |
| 6,052,076 A | 4/2000 | Patton, III et al. .......... 341/144 |
| 6,404,840 B1 * | 6/2002 | Sindalovsky ................ 377/48 |
| 6,445,326 B1 | 9/2002 | Donovan et al. ........... 341/155 |
| 6,738,858 B1 | 5/2004 | Fernald et al. ............. 710/317 |
| 6,856,268 B2 * | 2/2005 | Choi .......................... 341/144 |

(Continued)

OTHER PUBLICATIONS

Microchip Technology, Inc, AN538, "Using PWM to Generate Analog Output," 1997.

*Primary Examiner*—Cassandra Cox
(74) *Attorney, Agent, or Firm*—Polansky & Associates, PLLC; R. Michael Reed

(57) ABSTRACT

In an embodiment, a circuit device includes a first counter responsive to a clock signal and to a first control word having a first precision. The counter produces a first control signal related to the first control word at a first output. The circuit device further includes a second counter responsive to the clock signal and to a second control word having the first precision. The second counter produces a second control signal related to the second control word at a second output. The circuit device also includes a filtering circuit responsive to the first output and the second output to receive the first and second control words. The filtering circuit is adapted to produce an output control signal related to the first and second control words, where the output control signal has a second precision that is greater than the first precision.

18 Claims, 4 Drawing Sheets

U.S. PATENT DOCUMENTS

| | | | |
|---|---|---|---|
| 6,985,492 B1 * | 1/2006 | Thi et al. | 370/429 |
| 7,382,301 B2 | 6/2008 | Mourrier | 341/152 |
| 2008/0191921 A1 * | 8/2008 | Scholz et al. | 341/166 |

* cited by examiner

CIRCUIT DEVICE TO GENERATE A HIGH PRECISION CONTROL SIGNAL

FIELD

The present disclosure is generally related to a circuit device to generate a high-precision control signal, and more particularly to a circuit device adapted to convert a digital control word to an analog signal having a desired precision.

BACKGROUND

Pulse width modulated (PWM) signals are frequently used in digital circuitry, such as media processing circuits for use in audio applications, for example, to convert digital signals into an analog output signals. The PWM signals have a duty cycle, which is the ratio of a width of a PWM pulse to a period of the PWM signal, as determined by the PWM frequency. In a particular example, the period or frequency of the PWM signal may be referred to as a PWM frame rate. It is often desirable to convert the duty cycle of the PWM signal into an analog output, which can be used, for example, to control an analog device, such as a motor, a power supply, a speaker, another type of circuit, or any combination thereof.

Unfortunately, to generate a high precision analog control signal, the pulse width of the PWM signals has to be controlled to provide a number of steps that is related to a desired resolution. For example, if a desired resolution is 16-bits, then the pulse width of the PWM signal has to be controllable to provide ($2^{16}$) 65,536 steps within a PWM frame having a frame width (PWM_width) defined by the following equation:

$$\text{step\_size} = \frac{1}{2^{16}} * \text{PWM\_width} \quad \text{(Equation 1)}$$

In this particular example, if the PWM frame rate or frequency is 100 kHz, the PWM pulse time is 10 µs, which implies a PWM step size of approximately 150 ps. Such a small step size implies a clock speed of 6.5536 GHz, which may be higher than a nominal available clock.

Also, such high clock speeds consume more power than a slower clock. Further, such high clock speeds may not be necessary for other circuitry in a particular circuit device. Hence, there is a need for a digital-to-analog conversion circuit that can provide high resolution at lower clock rates without altering the frequency of the PWM signal.

SUMMARY

In an embodiment, a circuit device includes a first counter responsive to a clock signal and to a first control word having a first precision. The counter produces a first control signal related to the first control word at a first output. The circuit device further includes a second counter responsive to the clock signal and to a second control word having a second precision. The second counter produces a second control signal related to the second control word at a second output. The circuit device also includes a filtering circuit responsive to the first output and the second output to receive the first and second control words. The filtering circuit is adapted to produce an output control signal related to the first and second control words, where the output control signal has a third precision that is greater than the first precision and the second precision.

DETAILED DESCRIPTION OF ILLUSTRATIVE EMBODIMENTS

Figure 1:
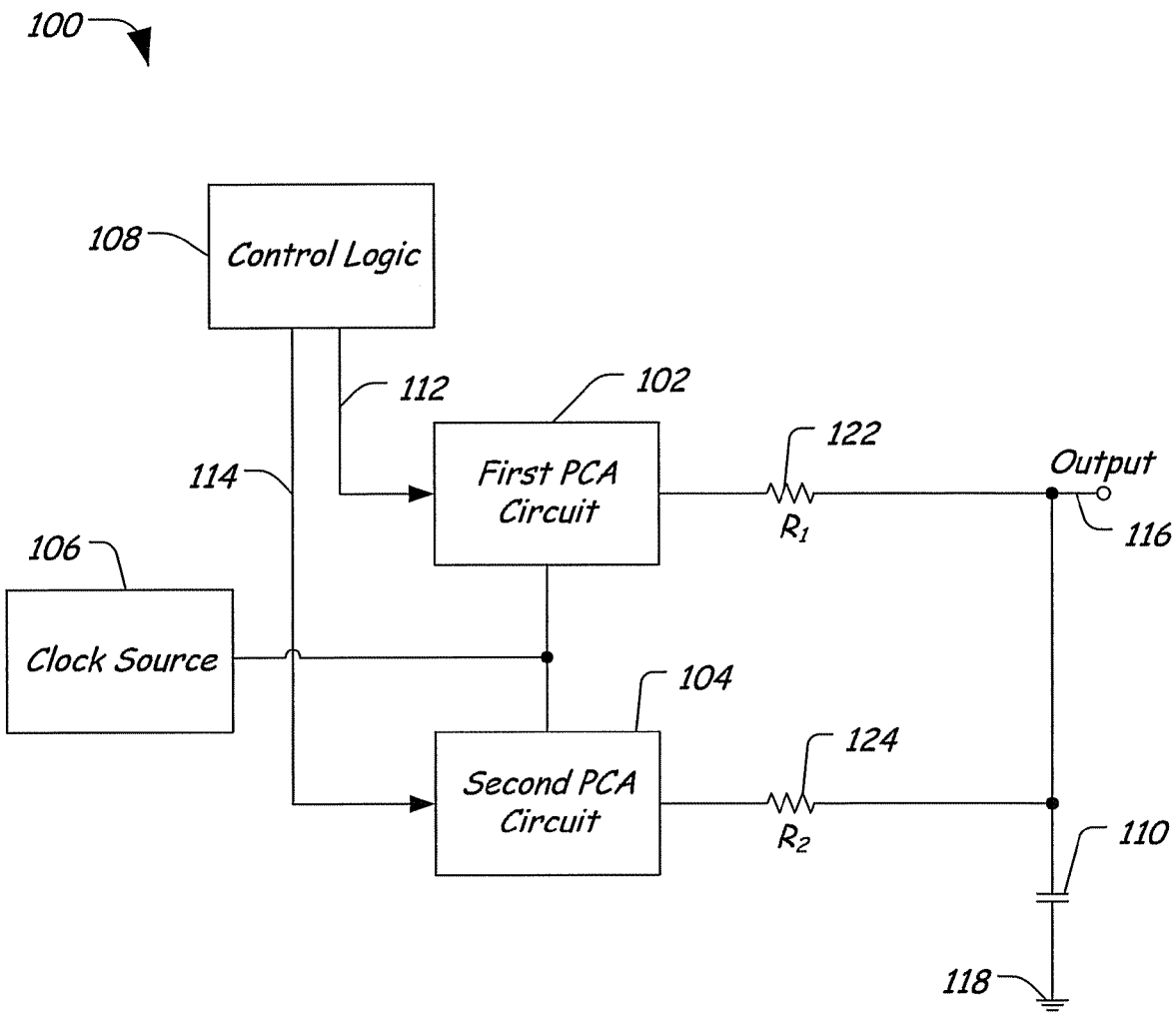
FIG. 1 is a block diagram of a particular illustrative embodiment of circuit device to generate an analog control signal having a desired precision.

FIG. 1 is a block diagram of a particular illustrative embodiment of circuit device 100 to generate an analog control signal having a desired precision. The circuit device 100 includes a first programmable counter array (PCA) circuit 102 and a second PCA circuit 104, which are responsive to a clock source 106 to receive a clock signal. The first PCA circuit 102 is responsive to control logic 108 to receive a first control word via line 112. The second PCA circuit 104 is responsive to the control logic 108 to receive a second control word via line 114. In a particular embodiment, the first and second PCA circuits 102 and 104 are adapted to receive first and second control words via lines 112 and 114 in the form of digital words that define coded values and produce analog output signals having magnitudes that represent the coded values. For example, a digital control word having 16 bit positions can define $2^{16}$ (i.e., 65,536) different values, which provides for a resolution of ⅟65,536. In another example, a digital control word having 8 bit positions can define $2^8$ (i.e., 256) different values, which provides for a resolution of ⅟256. Higher resolution provides greater precision in control of the analog signal.

The circuit device 100 also includes a first resistor ($R_1$) 122 that is coupled between the first PCA circuit 102 and an output terminal 116, and includes a second resistor ($R_2$) 124 that is coupled between the second PCA circuit 104 and the output terminal 116. The first and second resistors ($R_1$ and $R_2$) 122 and 124 provide a resistance divider circuit that is adapted to scale the outputs of the first and second PCA circuits 102 and 104 that when filtered, produce a high-resolution (relative to the digital control words and relative to the precision of each of the PCA circuits 102 and 104), analog output control signal. The analog output control signal can be used to control any number of circuits, such as a servo circuit, a motor, a power supply, another circuit, or any combination thereof. In a particular example, the analog output control signal can be controlled to provide a current or a voltage at a particular level and with a desired level of precision. A capacitor 110 is coupled between the output terminal 116 and a power supply, such as the electrical ground 118. The capacitor 110 is adapted to filter the output control signal at the output terminal 116. In a more general case, higher order filtering can be used so as to provide less ripple or faster transient response.

In a particular embodiment, the first PCA circuit 102 and the second PCA circuit 104 are 8-bit precision circuits that receive first and second eight-bit (8-bit) control words from the control logic 108 via lines 112 and 114 and that produce first and second 8-bit control signals. In this particular example, the first and second resistors ($R_1$ and $R_2$) 122 and 124 have an accuracy or precision of 8-bits. In a particular embodiment, the first resistor ($R_1$) has a first resistance, and the second resistor ($R_2$) has a second resistance, where the first and second resistances ($R_1$ and $R_2$) 122 and 124 are matched to define a desired ratio. In a particular embodiment, the ratio is selected based on the bit precision of the control words and the first and second PCA circuits 102 and 104. In this particular example, since the first and second PCA circuits 102 and 104 have a precision of 8-bits, the ratio of the first resistance ($R_1$) to the second resistance ($R_2$) is $2^8$, or approximately 256 to 1. In this particular example, by providing the first and second resistors (R1 and R2) 122 and 124 with the selected ratio (of 256 to 1), the circuit device 100 is adapted to generate a 16-bit output control signal at the output terminal 116 from two 8-bit output signals from the first and second PCA circuits 102 and 104.

In conventional devices, to generate a high precision analog control signal, the pulse width of the PWM signals has to be controlled to provide a number of steps that is related to a desired resolution. For example, if a desired resolution is 16-bits, then the pulse width of the PWM signal has to be controllable to provide ($2^{16}$) 65,536 steps within a PWM frame according to the following equation:

$$\text{step\_size} = \frac{1}{2^{16}} * \text{PWM\_width} \qquad \text{(Equation 1)}$$

In such a system, if the PWM frame rate or frequency is 100 kHz, the PWM pulse time is 10 μs, which implies a PWM step size of approximately 150 ps. Such a small step size implies a clock speed of 6.5536 GHz. However, the circuit device 100 makes it possible to provide the 16-bit output control signal with a lower clock frequency by combining and filtering the two PWM signals. In a particular embodiment, the clock source 106 is adapted to provide a 25.6 MHz clock.

In a particular example, if the first and second PCA circuits 102 and 104 are controlled by first and second 8-bit control words from the control logic 108 via the lines 112 and 114, the average output of each of the first and second PCA circuits 102 and 104 is defined by the following equation:

$$\frac{D}{2^8} * V_p = \frac{DV_p}{256} = \text{Average Output} \qquad \text{(Equation 2)}$$

where the variable (D) represents the 8-bit control word and the variable ($V_p$) represents the output value of the particular PCA circuit.

The first and second resistors ($R_1$ and $R_2$) 122 and 124 provide a resistor divider circuit that can be used to combine the first and second outputs at a ratio that produces an output having a precision that is greater than 8-bits. By superposition, the averaged output (Vout) is the average of the first and second outputs from the first and second PCA circuits 102 and 104 fed to the first and second resistors 122 and 124 (i.e., the resistor divider circuit), such that the averaged output can be determined according to the following equation:

$$V_{out} = \frac{D_2}{256} + \left[\frac{D_1 V_p}{256} - \frac{D_2 V_p}{256}\right]\frac{R_1}{R_1+R_2} \qquad \text{(Equation 3)}$$

$$V_{out} = \frac{R_2}{R_1+R_2}\frac{D_2 V_p}{256} + \frac{R_1}{R_1+R_2}\frac{D_1 V_p}{256} \qquad \text{(Equation 4)}$$

where the variables (D1 and D2) represent the first and second control words, respectively.

In a particular embodiment, to provide an appropriate ratio for the divider circuit at the outputs of the first and second PCA circuits 102 and 104, the ratio can be determined according to the following equation:

$$2^8 = \frac{\frac{R_2}{R_1+R_2}}{\frac{R_1}{R_1+R_2}} = \frac{R_2}{R_1} = 256 \qquad \text{(Equation 5)}$$

It should be understood that the particular ratio is determined by the number of bits. In a particular embodiment, the ratio may vary as the number of bits varies. For example, a bit precision of 10 results in a ratio of $2^{10}$ or 1,024.

In a particular example, when the ratio between the first resistor and the second resistor is 256, the average output voltage (Vout_average) can be determined according to the following equation:

$$\text{Vout\_average} = \frac{256*V_p*D_2}{256*257} + \frac{V_p*D_1}{257*256} \qquad \text{(Equation 6)}$$

$$= \frac{V_p}{65792}[256*D_2 + D_1]$$

If the first PCA circuit is controlled by a first 8-bit control word ($D_1$) and the second PCA circuit is controlled by a second 8-bit control word ($D_2$), the time averaged output is the same as would be generated by a 16-bit control word ($D_3$) as follows:

$$D_3 = 256D_2 + D_1 \qquad \text{(Equation 7)}$$

As long as each PCA output has 8-bits of linearity, the overall combination will have 16-bits of linearity, allowing for lower-precision resistors and PCA circuits to provide a higher precision output than otherwise would be expected. One particular advantage provided by the circuit device 100 is that the impulse response is approximately the same as would be obtained by the more difficult to implement system with a clock frequency of 6.5536 GHz and a 16-bit PCA circuit. Instead, a 25.6 MHz clock signal can be used with two 8-bit PCA circuits 102 and 104 to produce a 16-bit control signal at the output 116. Further, the time constant at the output 116 is substantially unchanged by the second resistor ($R_2$) 124. In particular, the time constant (Time_const) at the output 116 is determined as follows:

$$\text{Time\_const} = \frac{R*256}{257}*C \approx RC \qquad \text{(Equation 8)}$$

where the ratio of the resistances ($R_1$ and $R_2$) 122 and 124 is 256. While the equation becomes increasingly complex with more counter circuits and more resistors, the additional counter circuits and resistors have a negligible impact on the time constant at the output terminal 116, provided that the resistors are matched to provide a desired ratio of resistances.

In a particular example, the resistances can be matched to provide a desired ratio. Further, the particular circuit device 100 can be extended to any number (M) of n-bit PCA circuits to get (M*N)-bit resolution in generating an analog output control signal.

It should be understood that 16-bit performance for the two 8-bit PCA circuits requires 8-bit matching of the resistors. If the resistor matching is 1% (i.e., within 1% tolerance), the bit-performance can still be 14 or 15-bits. Depending on the implementation, such bit-performance may be acceptable. In another particular embodiment, a 24-bit performance can be achieved using 12-bit PCA circuits and 12-bit matched resistors. Further, the performance can be extended to additional counters and additional matched resistors by extending the ratios and by increasing the bit-precision of the various components. In each instance, the analog output control signal can have a higher bit-precision than the first and second control words.

In a particular example, the first and second control words can represent most significant and least significant bits, respectively, of a control word. For example, the first control word can represent the most significant 8-bits of a 16-bit control word, and the second control word can represent the least significant 8-bits of the 16-bit control word. In this instance, the most significant bits can be used to control the first PCA circuit 102 and the least significant bits can be used to control the second PCA circuit 104.

Figure 2:
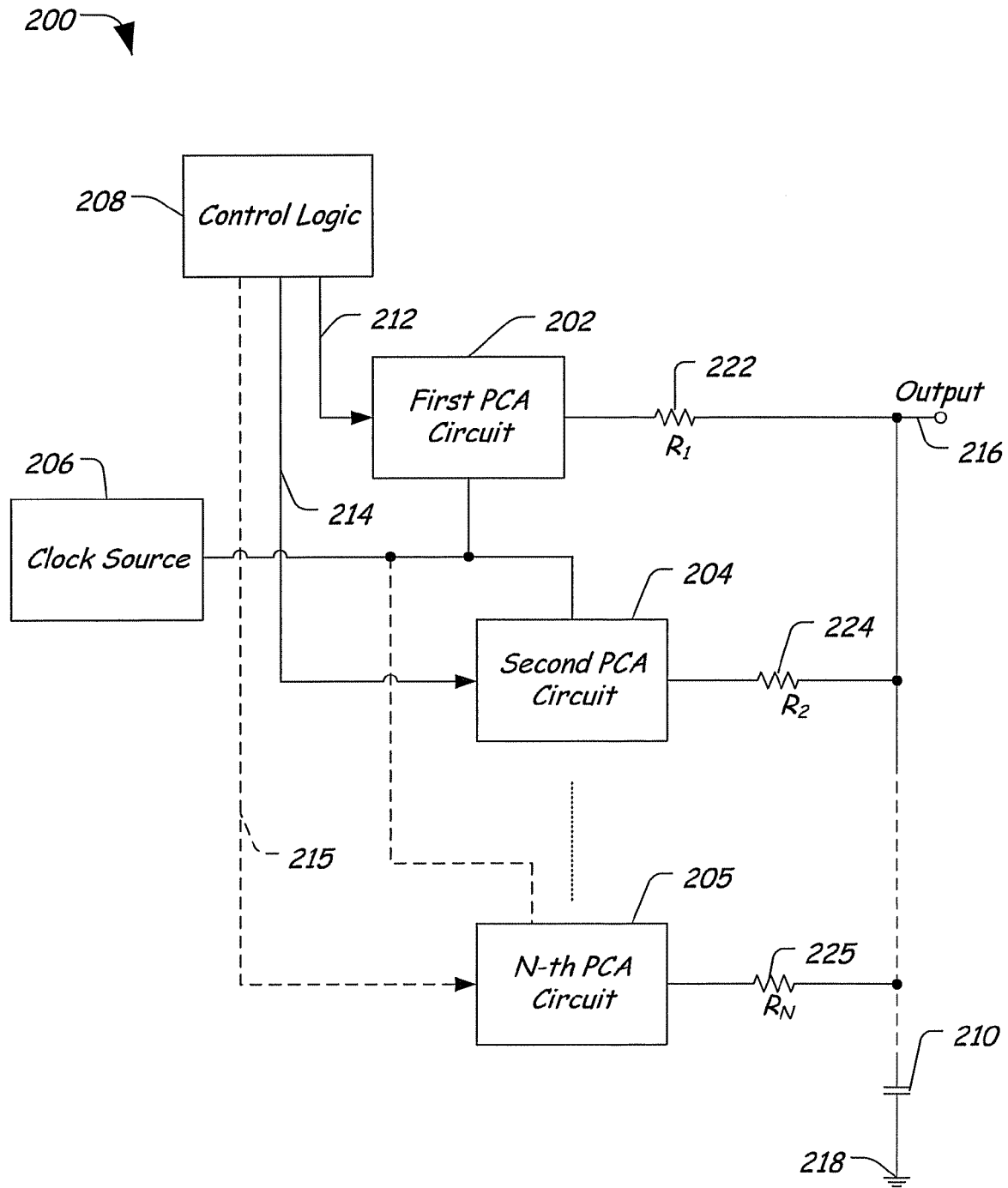
FIG. 2 is a block diagram of a second particular illustrative embodiment of a circuit device to generate an analog control signal having a desired precision.

FIG. 2 is a block diagram of a second particular illustrative embodiment of a circuit device 200 to generate an analog control signal having a desired precision. The circuit device 200 includes a first programmable counter array (PCA) circuit 202 and a second PCA circuit 204, which are responsive to a clock source 206 to receive a clock signal. The first PCA circuit 202 is responsive to control logic 208 to receive a first control word via line 212. The second PCA circuit 204 is responsive to the control logic 208 to receive a second control word via line 214. The circuit device 200 also includes an n-th PCA circuit 205 that is responsive to the clock source 206 to receive the clock signal and is responsive to the control logic 208 to receive an n-th control word via the control line 215. Each of the first, second, and n-th PCA circuits 202, 204, and 205 are adapted to generate output control signals having a bit-precision corresponding to the respective control word from the control logic 208 and related to the clock signal from the clock source 206. In particular, since each of the first, second, and n-th PCA circuits 202, 204, and 205 are adapted to count the clock signals and to produce an output control signal having a respective amplitude that is related to the control word.

The circuit device 200 also includes a first resistor ($R_1$) 222 that is coupled between the first PCA circuit 202 and an output terminal 216, and includes a second resistor ($R_2$) 224 that is coupled between the second PCA circuit 204 and the output terminal 216. Further, the circuit device 200 includes an n-th resistor ($R_N$) 225 that is coupled between the n-th PCA circuit 205 and the output terminal 216. A capacitor 210 is coupled between the output terminal 216 and a power supply, such as the electrical ground 218. In a particular embodiment, the circuit device 200 can include any number of PCA circuits and associated resistors and control lines to provide an output control signal having a desired level of granularity.

In this particular embodiment, the control logic 208 is adapted to selectively activate the n-th PCA circuit 205 to adjust the linearity of the output control signal, reducing the size of the steps between adjacent values of the output signal. In a particular example, provided that the precision of the PCA circuits and the resistors are sufficiently high and provided that the resistors are matched appropriately, the output code signal from the circuit can have an adjustable (scalable) precision that can programmatically controlled by the control logic 208 by providing the control words to the active PCA circuits. In this particular instance, the precision of the resistors and the PCAs may be greater than a maximum programmable precision, even if the precision level needed for a particular application is less than the full capability of the circuit, thereby ensuring that the selected precision can be provided.

Figure 3:
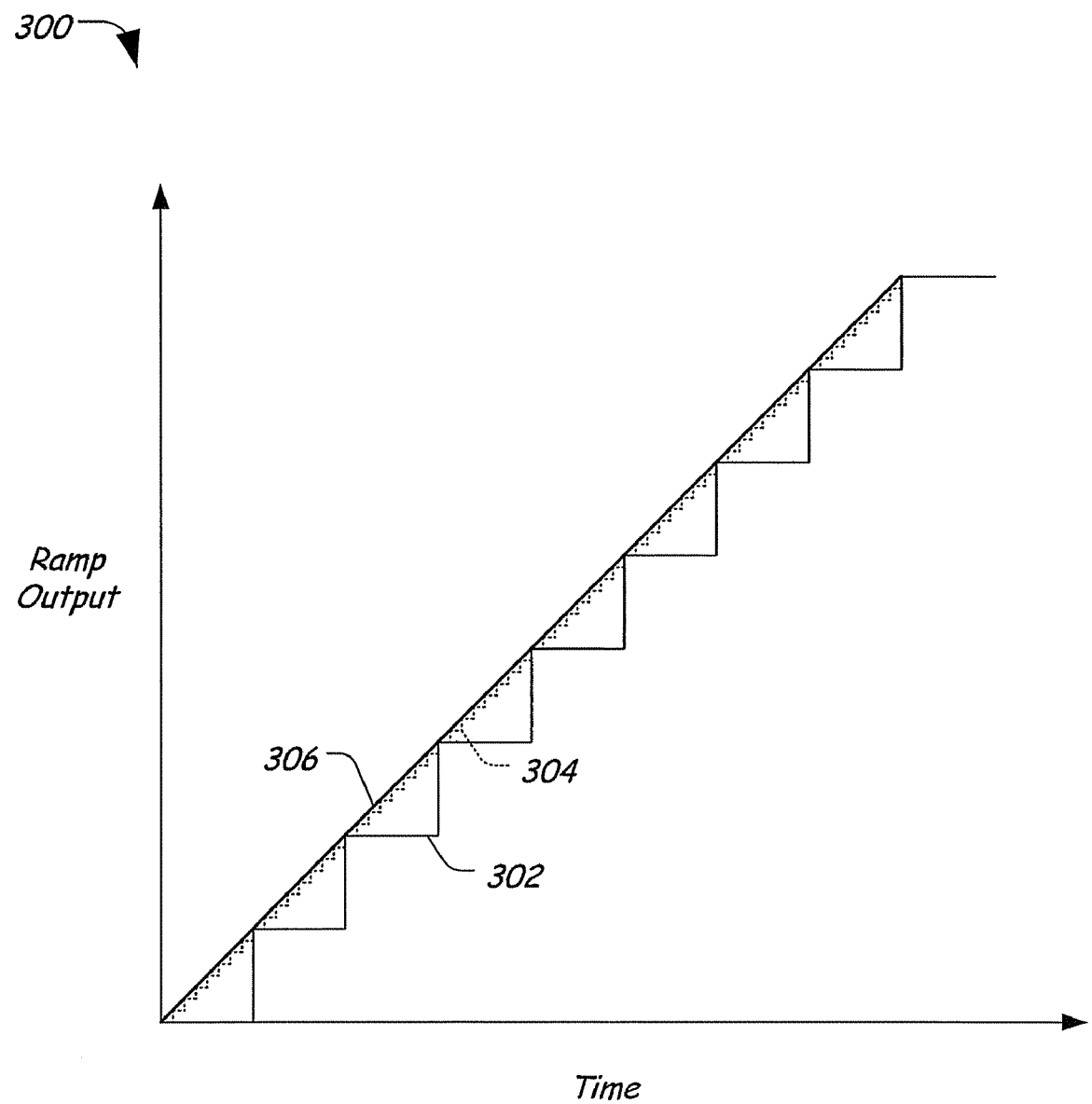
FIG. 3 is a graph of an analog output provided by the circuit device of FIG. 1.

FIG. 3 is a graph of an analog output 300 provided by the circuit device of FIG. 1. The analog output 300 includes a first signal 302 provided by the first PCA circuit in response to the clock signal and to the first control word. For the purposes of illustration, the PCA circuits are chosen to have 3-bit control for 8 possible steps. The first signal 302 provides 3-bits of precision over the entire range of the output. The analog output 300 further includes a second signal 304 provided by the second PCA circuit in response to the clock signal and to the second control word. The second signal 304 provides eight additional levels of precision for each step of the first signal 302. The analog output 300 further includes the combined output (averaged output) 306, which represents a combined contribution from the first and the second signals 304 and 306 and which has 6-bits of control over the entire range of the analog output 300.

As shown, the analog output 300 has a greater precision than either of the PCA outputs 302 and 304, independently. Further, adding additional PCA circuits can provide further precision, allowing a relatively slow clock and a relatively low bit-precision circuit to provide an output control signal having a precision than is greater than the precision allowed by either of PCA outputs.

Figure 4:
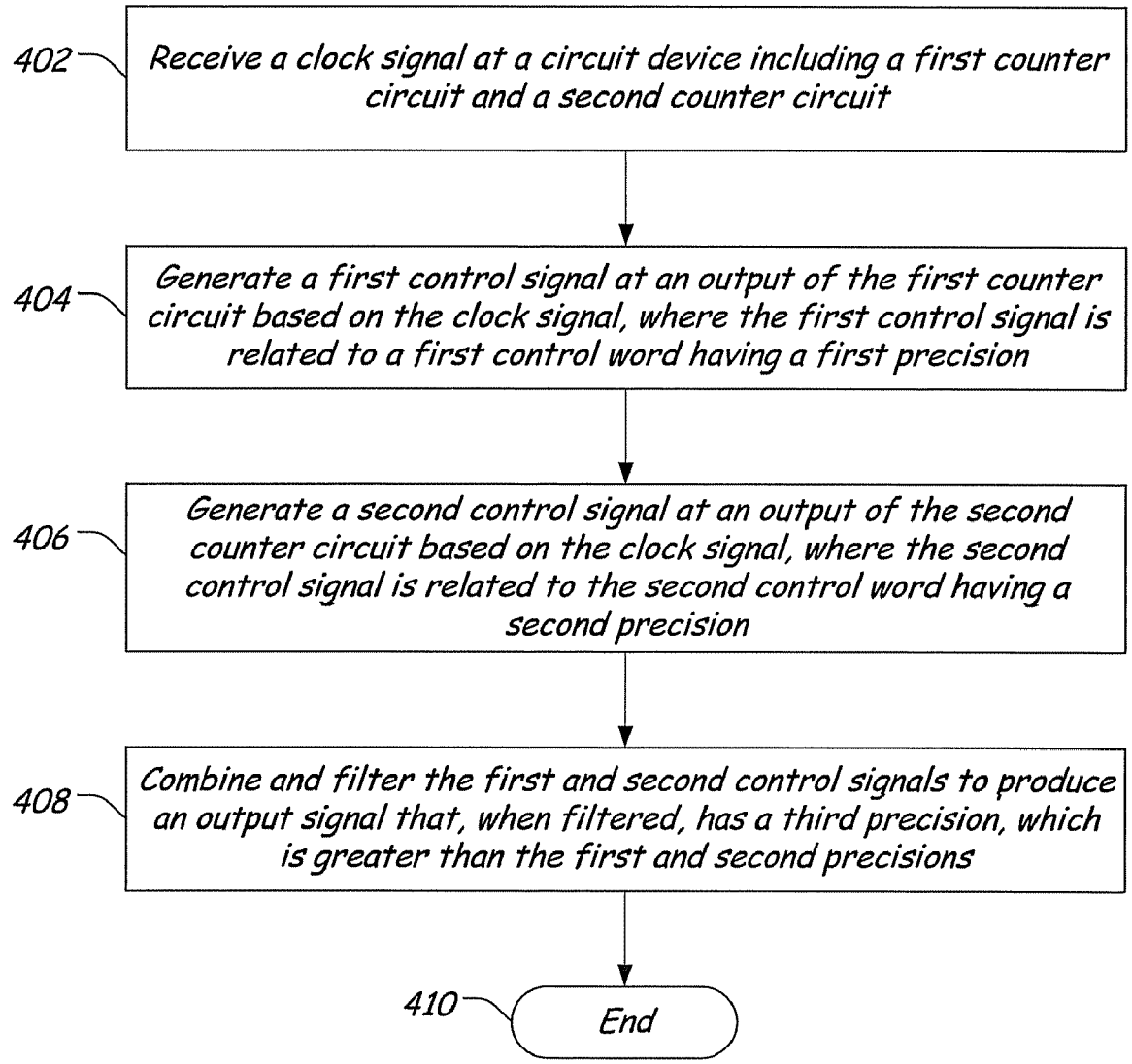
FIG. 4 is a flow diagram of a particular illustrative embodiment of a method of providing an analog control signal having a desired precision.

FIG. 4 is a flow diagram of a particular illustrative embodiment of a method of providing an analog control signal having a desired precision. At 402, a clock signal is received at a circuit device including a first counter circuit and a second counter circuit. In a particular embodiment, the first and second counter circuits can be programmable counter arrays having a selected level of precision. Advancing to 404, a first control signal is generated at an output of the first counter circuit based on a clock signal, where the first control signal is related to a first control word having a first precision. Continuing to 406, a second control signal is generated at an output of the second counter circuit based on clock signal, where the second control signal is related to a second control word having a second precision.

Proceeding to 408, the first and second control signals are combined and filtered to produce an output signal having a third precision, which is greater than the first and second precisions. In a particular embodiment, the first and second control signals are combined using resistors matched to have a particular ratio of resistances and where each resistor had a desired precision. In a particular embodiment, the first and second counter circuits are adapted to produce an output with 8-bits of precision and the circuit device is adapted to generate a 16-bit output signal based on the 8-bit control words generated by the counter circuits. In another particular embodiment, two 16-bit counters are used in conjunction with the averaging circuit to produce a 24-bit output control signal. The method terminates at 410.

In conjunction with the circuit devices and the methods described above with respect to FIGS. 1-4, a circuit device is disclosed that is scalable to produce an output control signal having a desired level of precision, using components that have a lower precision than the desired output. In a particular example, the circuit device is adapted to receive a 25.6 MHz clock signal and to use 8-bit control words to produce a 16-bit output control signal using matched resistors defining a ratio of 256 to 1 to produce the desired resolution (i.e., 65,536 steps). In a particular example, multiple counter circuits and associated matched resistors can be used with a negligible impact on the time constant at the output terminal to provide an analog output signal having a desired precision.

Although the present invention has been described with reference to preferred embodiments, workers skilled in the art will recognize that changes may be made in form and detail without departing from the spirit and scope of the invention.

What is claimed is:

1. A circuit device comprising:
    a first counter circuit responsive to a clock signal and to a first control word having a first precision to produce a first control signal related to the first control word at a first output;
    a second counter circuit responsive to the clock signal and to a second control word having the first precision to produce a second control signal related to the second control word at a second output; and
    a filtering circuit responsive to the first output and the second output, the filtering circuit adapted to produce an output signal related to the first and second control words, the output signal having a second precision that is greater than the first precision that would be obtained by filtering only the first or second output, the filtering circuit comprising:
        a first resistor having a first resistance coupled between the first output and the output node; and
        a second resistor having a second resistance coupled between the second output and the output node;
        wherein the first resistance and the second resistance define a ratio related to the first precision.

2. The circuit device of claim 1, wherein the first and second counter circuits comprise programmable counter array circuits adapted to produce the first and second outputs having magnitudes that represent the first and second control words.

3. The circuit device of claim 1, wherein the first precision comprises an 8-bit precision and wherein the second precision comprises a 16-bit precision.

4. The circuit device of claim 1, wherein the first resistance and the second resistance are accurate to the first precision.

5. The circuit device of claim 1, wherein the ratio comprises a ratio of 256 to 1 when the first precision is 8-bits.

6. The circuit device of claim 1, further comprising a capacitor coupled to the output node.

7. A circuit device comprising:
    a first counter circuit responsive to a clock signal and to a first control word having a first precision to produce a first control signal related to the first control word at a first output;
    at least one second counter circuit responsive to the clock signal and to a respective at least one second control word having the first precision to provide a respective at least one second control signal related to the respective at least one second control word to at least one second output;
    a filtering circuit responsive to the first output and to the at least one second output, the filtering circuit adapted to produce an output control signal related to the first control signal and the respective at least one second control signal, wherein the output control signal has a second precision that is greater than the first precision; and
    a control logic circuit adapted to provide the first control word to the first counter circuit and to selectively provide the at least one second control word to the respective at least one second counter circuit.

8. The circuit device of claim 7, wherein the control logic circuit is adapted to selectively provide the at least one second control word to selectively adjust a linearity associated with the output control signal.

9. The circuit device of claim 8, wherein the at least one second counter circuit comprises a third counter circuit responsive to the clock signal, and wherein the control logic circuit is adapted to selectively provide a third control word to the third counter circuit.

10. The circuit device of claim 9, wherein the at least one second counter circuit comprises a second counter circuit and a third counter circuit, wherein the control circuit is adapted to provide a second control word to the second counter circuit and to selectively provide a third control word to the third counter circuit.

11. The circuit device of claim 10, wherein the third control word is selectively provided to the third counter circuit to adjust a bit-precision associated with the output signal.

12. A circuit device comprising:
    a first programmable counter array (PCA) circuit responsive to a clock signal and adapted to receive a first control word having a first precision, the first PCA circuit adapted to produce a first output word based on the clock signal and having the first precision;
    a second PCA circuit responsive to the clock signal and adapted to receive a second control word having a second precision, the second PCA circuit adapted to produce a second output signal based on the clock signal and having the second precision;
    a filtering circuit adapted to responsive to the first and second PCA circuits and adapted to filter the first output word and the second output word to produce an output control signal at an output terminal, the output control signal having a third precision that is greater than the first and second precisions.

13. The circuit device of claim 12, further comprising a capacitor coupled to output terminal to filter the output signal.

14. The circuit device of claim 12, wherein the filtering circuit comprises:
    a first resistor having a first resistance coupled between the first PCA circuit and the output terminal; and
    a second resistor having a second resistance coupled between the second PCA circuit and the output terminal.

15. The circuit device of claim 14, wherein the first resistor has a first accuracy that corresponds to the first precision and wherein the second resistor has a second accuracy that corresponds to the second precision.

16. The circuit device of claim 14, wherein a ratio of the first resistance to the second resistance is related to the first precision.

17. The circuit device of claim 12, wherein the first precision and the second precision represent 8-bit precision and wherein the third precision comprises 16-bit precision.

18. The circuit device of claim 17, wherein the clock signal comprises a 25.6 MHz clock signal.

* * * * *